(12) United States Patent
Zimmer et al.

(10) Patent No.: US 12,140,622 B2
(45) Date of Patent: Nov. 12, 2024

(54) BREAKDOWN VOLTAGE DETECTION

(71) Applicant: X-FAB Global Services GmbH, Erfurt (DE)

(72) Inventors: Alexander Zimmer, Uhlstädt-Kirchhasel (DE); Daniel Gäbler, Apolda (DE)

(73) Assignee: X-FAB Global Services GmbH, Erfurt (DE)

( * ) Notice: Subject to any disclaimer, the term of this patent is extended or adjusted under 35 U.S.C. 154(b) by 726 days.

(21) Appl. No.: 17/178,599

(22) Filed: Feb. 18, 2021

(65) Prior Publication Data

US 2021/0255231 A1 Aug. 19, 2021

(30) Foreign Application Priority Data

Feb. 19, 2020 (GB) .................................. 2002295

(51) Int. Cl.
H01L 31/02 (2006.01)
G01J 1/44 (2006.01)
G01R 31/12 (2020.01)
H01L 27/146 (2006.01)

(52) U.S. Cl.
CPC ............. *G01R 31/129* (2013.01); *G01J 1/44* (2013.01); *H01L 27/14643* (2013.01); *G01J 2001/4466* (2013.01); *G01J 2001/448* (2013.01)

(58) Field of Classification Search
CPC .................................................. H01L 31/02027
See application file for complete search history.

(56) References Cited

U.S. PATENT DOCUMENTS

| 5,929,982 | A | 7/1999 | Anderson |
| 6,222,660 | B1 | 4/2001 | Traa |
| 6,313,459 | B1 | 11/2001 | Hoffe et al. |
| 2010/0245809 | A1 | 9/2010 | Andreou et al. |
| 2010/0301194 | A1 | 12/2010 | Patel et al. |
| 2014/0191115 | A1 | 7/2014 | Webster et al. |
| 2019/0006399 | A1* | 1/2019 | Otake ............... H01L 31/107 |
| 2019/0067495 | A1 | 2/2019 | Daly et al. |

FOREIGN PATENT DOCUMENTS

EP 3 435 422 1/2019

OTHER PUBLICATIONS

GB Search Report for corresponding Application No. GB2002295. 0, Nov. 25, 2020—5 pages.
English translation of the German Office Action for corresponding Application No. 102021103422.1, dated Mar. 18, 2024, 11 pages.

* cited by examiner

*Primary Examiner* — Jae Lee
(74) *Attorney, Agent, or Firm* — Dority & Manning, P.A.

(57) ABSTRACT

A semiconductor structure for measuring a breakdown voltage of a pn-junction, said semiconductor structure comprises:
a substrate;
a sensor device comprising an optical active region comprising said pn-junction in said substrate, wherein said sensor device is configured to apply a reverse bias voltage to said pn-junction; and
an emitter located adjacent to said optical active region in said substrate and configured to provide charge carriers to said optical active region in order to trigger breakdown of said pn-junction when said reverse bias voltage is equal to or greater than said breakdown voltage.

15 Claims, 3 Drawing Sheets

BREAKDOWN VOLTAGE DETECTION

TECHNICAL FIELD

The invention relates to breakdown voltage detection and in particular to breakdown voltage detection of a pn-junction in a sensor device.

BACKGROUND

Photo sensors such as single photon avalanche diodes (SPADs) are used in a so called Geiger mode to count single photons. In this operating mode, the device is reverse biased over the breakdown voltage. It is important to accurately determine the breakdown voltage for correct operation of the device.

Existing methods make use of external heat or light sources to trigger breakdown in order to measure the breakdown voltage of the device.

SUMMARY

Aspects of the invention provide semiconductor structures for and methods of measuring breakdown voltage, as well as an image sensor as set out in the appended claims.

Preferred embodiments are descried below with reference to the accompanying drawings.

DETAILED DESCRIPTION

Avalanche photodiodes (APDs) operate below their breakdown voltage while single photon avalanche diodes (SPADs) operate above their breakdown voltage. In both cases, the breakdown voltage should be accurately determined for optimal device operation. The breakdown voltage of APDs and SPADs can be determined by triggering breakdown while measuring the bias voltage. A fundamental condition for an avalanche breakdown is to have at least one carrier in the avalanche junction that can trigger the breakdown. For some applications, particularly in dark or low light environments, this condition might not be reliably achieved, and the avalanche cannot then be triggered fast enough. If carriers are missing when the breakdown voltage is reached then breakdown may be delayed and an artificially high breakdown voltage measured. Using the incorrect value for the breakdown voltage, the wrong bias voltage may be applied to the sensor device, which may disturb the device's functionality and/or lower its performance.

To overcome this problem additional carriers in the avalanche junction can be provided by thermal generation of carriers or by illuminating the sensor. If heating or illumination is not feasible, then the measuring holding time for a carrier to trigger breakdown can also be extended, but this can be disadvantageous to the timing response.

Figure 1:
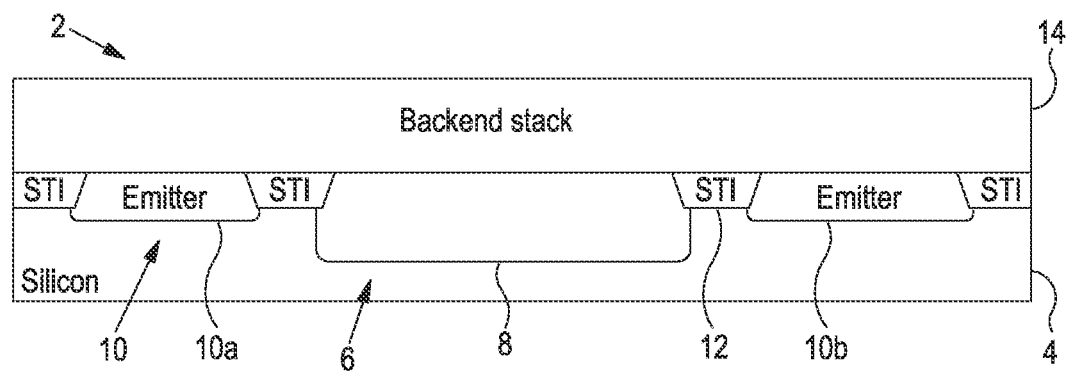
FIG. 1 shows a schematic diagram of a cross section of a semiconductor structure according to an embodiment.

FIG. 1 shows a cross sectional diagram of a semiconductor structure 2 according to an embodiment. The structure 2 comprises a substrate 4 (typically being a silicon substrate), a sensor device 6 comprising an optical active region 8 formed in the substrate 4. The sensor device 6 is typically a photodiode having a pn-junction, wherein the optical active region 8 corresponds to the depletion region around the pn-junction, wherein charge carriers generated by absorbed photons can be detected. The structure 2 further comprises an emitter 10 comprising a plurality of emitter regions 10*a* and 10*b* (two shown) for providing charge carriers to the optical active region 8 so as to trigger the sensor device 6. For example, where the sensor device 6 is a single photon avalanche diode (SPAD), the emitter 10 can be biased to generate charge carriers that initiate an avalanche current in the optical active region 8. The emitter 10 can be separated from the optical active region 8 by shallow trench isolation (STI) 12. A backend stack 14, comprising metallization and inter-metal dielectric layers, is located on the substrate 4, and can provide connections to the emitters 10*a* and 10*b* and to the sensor device 6.

Each emitter region 10*a* and 10*b* may comprise a heavily n-doped region (n++) and a heavily p-doped region (p++), preferably where the n++ region is self-aligned against the p++ region, which can protect the device against process deviations. The emitter 10 may preferably be configured to operate at relatively low reverse bias voltage in the range of 1 V to 5 V. The sensor device may comprise a peripheral region, surrounding the optical active region, wherein device circuitry may be located. In preferable embodiments, the emitter 10 is located in the peripheral region, which can reduce the device footprint and increase device density. That is, in preferred embodiments, the emitter 10 is shaped and positioned such that the footprint of the semiconductor structure 2 is the same as that of a corresponding semiconductor structure not having an emitter. The emitter regions 10*a* and 10*b* may be arranged symmetrically around the optical active region 8, and may have a substantially triangular shape (when viewed from above), which can allow the emitter regions 10*a* and 10*b* to be located entirely within the peripheral region of the sensor device 6.

Figure 2:
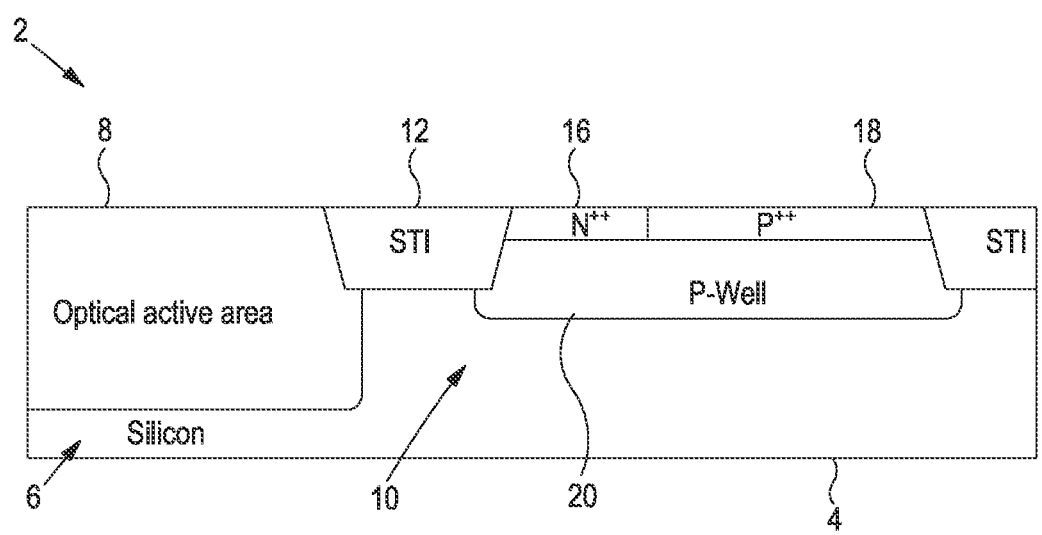
FIG. 2 shows a schematic diagram of a cross section of a part of a semiconductor structure according to an embodiment.

FIG. 2 shows a part of a semiconductor structure 2 according to an embodiment. The structure 2 may be the structure illustrated in FIG. 1, and corresponding features in different figures have been given the same reference numerals for clarity, and are not meant to limit those features. The semiconductor structure 2 comprises a sensor device 6 (e.g. a SPAD or APD) comprising an optical active region 8 in a silicon substrate 4. A trench 12 filled with STI material separates the optical active region 8 from an emitter 10. The emitter 10 comprises a heavily n-doped region 16 (n++) laterally adjacent and self-aligned against a heavily p-doped region 18 (p++). The n++ region 16 is self-aligned at the STI 12 edge (because the doping does not go through the STI 12 so that one edge of the n++ region 16 is defined by the STI 12). The other side of the n++ region 16 (towards the p++ region 18) is defined by the n-doping resist mask (not shown). To minimize tolerances, the p++ region 18 is located under the n++ region 16, so that only the n-doping resist mask edge defines the second edge of the n++ region 16. Hence, the tolerances of the n++ region 16 is defined by the overlay error and the critical dimension (CD) error of the n-doping mask against the STI 12. In contrast, if the p-doping would have been designed to have the p-doping resist mask butting the n-doping resist mask, additional tolerances of the p++ overlay and CD would increase overall tolerances. The relevant pn-junction of the emitter 10 is formed at the point where the n++ edge crosses the p++ region 18. By having the p++ region 18 completely overlap the n++ region 16 the process tolerances can be minimized and a more stable emitter performance provided.

Both the n++ region 16 and the p++ region 18 are located in a p-doped well 20 in the substrate 4. The emitter 10 is thereby configured to provide charge carriers to the optical active region 8 by applying a reverse bias to the emitter 10. For example, the emitter may be configured to operate at a reverse bias voltage 2.9 V and a current of 1 mA, in order to inject charge carriers into the optical active region 8 to thereby trigger breakdown in the sensor device 6 (when the reverse bias voltage across a pn-junction of the device 6 is equal to or greater than the breakdown voltage of the pn-junction).

Figure 3A:
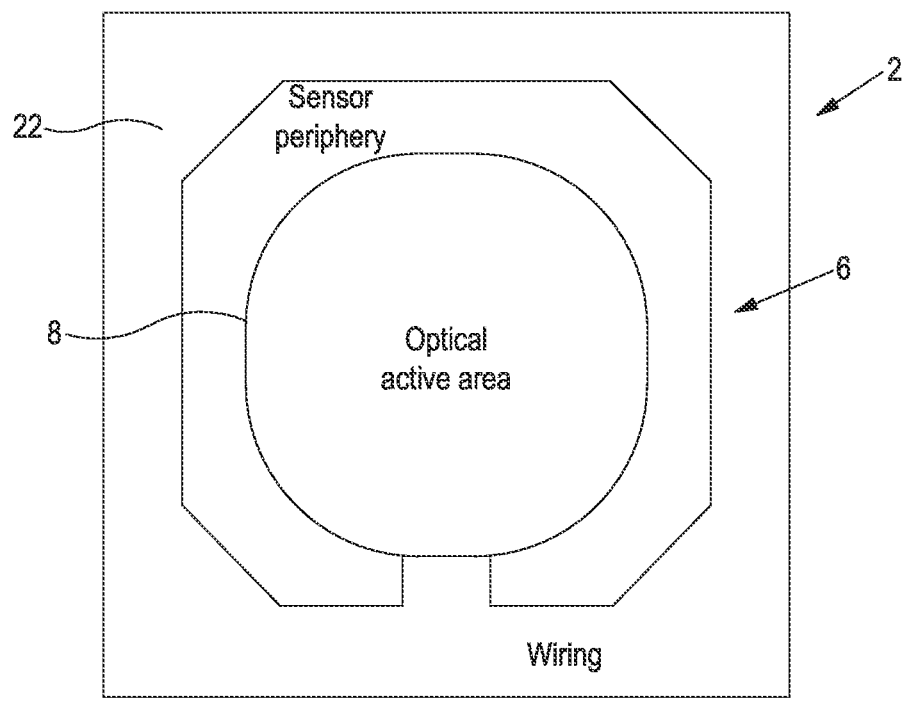
FIG. 3*a* shows a schematic top view of a semiconductor structure without emitter.
Figure 3B:
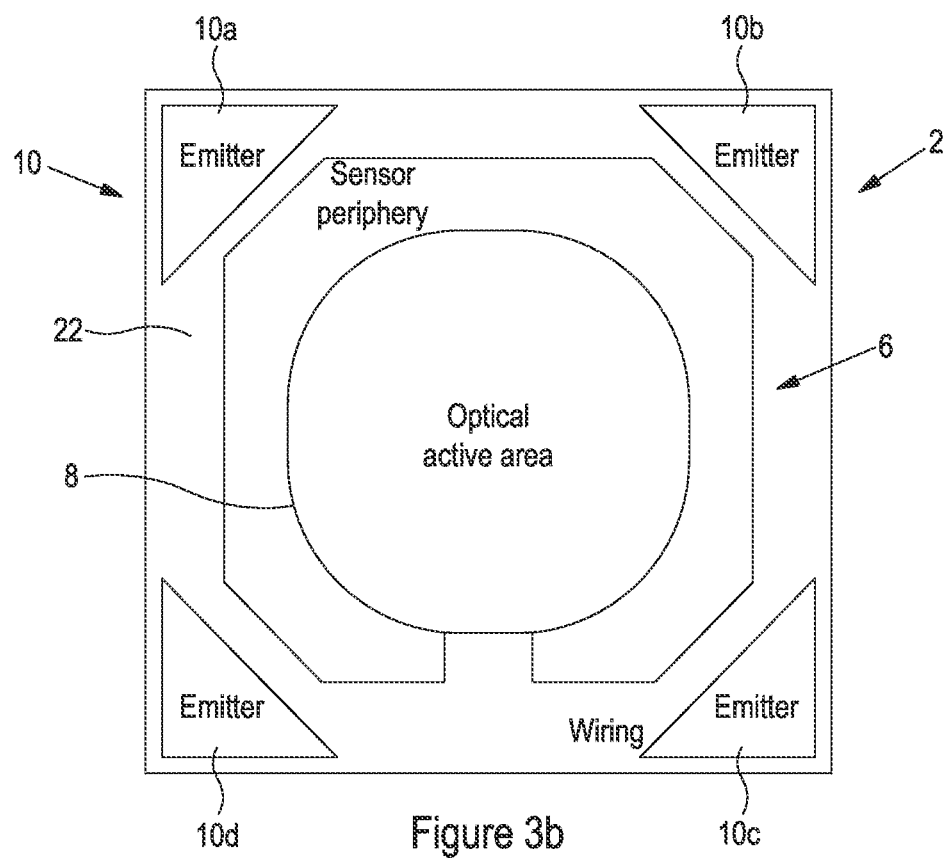
FIG. 3*b* shows a schematic top view of a semiconductor structure with an emitter according to an embodiment.

FIGS. 3a and 3b are schematic top views of a semiconductor structure 2 without emitters and a semiconductor structure 2 according to an embodiment comprising an emitter 10 respectively. Both structures 2 have a sensor device 6 with an optical active region 8 surrounded by a peripheral region 22, within which wiring for connecting to the optical active region 8 is located.

In FIG. 3b, an emitter 10 comprises four emitter regions 10a, 10b, 10c and 10d located symmetrically around the optical active region 8 in the peripheral region 22 of the sensor device 6. The emitter regions 10a, 10b, 10c and 10d have a triangular shape, so that they are entirely contained within the peripheral region 22, thereby not increasing the foot print of the device 6 compared to that of the device 6 in FIG. 3a. That is, no additional area is occupied by the structure 2, and the fill factor of the device 2 can remain unchanged. The emitter 10 only requires one more contact, in order to apply a voltage to the emitter 10.

An image sensor (e.g. a time of flight sensor) may comprise a plurality of semiconductor structures as described herein, so as to form an array of sensor devices (e.g. an array of SPADs). Each semiconductor structure of the plurality may be formed on the same wafer using the same process steps (typically in a CMOS process).

Figure 4:
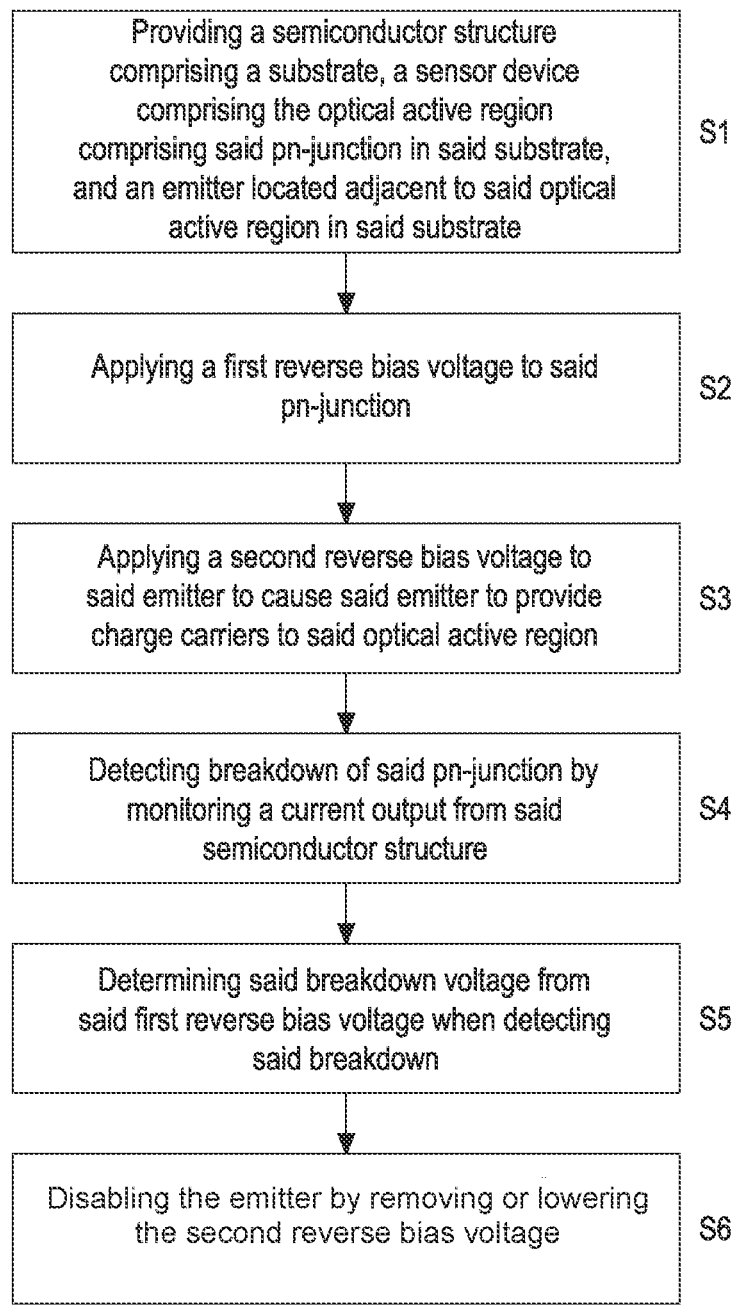
FIG. 4 shows a flow diagram with the steps of a method of measuring breakdown voltage according to an embodiment.

FIG. 4 is a flow diagram illustrating the steps of a method of measuring the breakdown voltage of a pn-junction, such as the pn-junction in the optical active region of a SPAD. The method comprises providing a semiconductor structure comprising a substrate, a sensor device comprising the optical active region comprising said pn-junction in said substrate, and an emitter located adjacent to said optical active region in said substrate (step S1). That is, the semiconductor structure (e.g. a structure as illustrated in any of FIG. 1, 2 or 3b) with the pn-junction to be tested is provided in step S1. Step S1 typically comprises forming the semiconductor structure in a CMOS process. The method then comprises applying a first reverse bias voltage to said pn-junction (step S2), applying a second reverse bias voltage to said emitter to cause said emitter to provide charge carriers to said optical active region (step S3) and detecting breakdown of said pn-junction by monitoring a current output from said semiconductor structure (step S4). The method further comprises determining said breakdown voltage from said first reverse bias voltage when detecting said breakdown (step S5). The reverse bias applied to the pn-junction in step S2 can be continuously or incrementally increased until breakdown is detected in step S4. The method may then comprise, after determining the breakdown voltage, disabling the emitter by removing or lowering the second reverse bias voltage (step S6).

The emitter may be used for a short time (e.g. <1 ms) in order to accurately measure the breakdown voltage, after which time the emitter can be disabled and left floating. While the emitter is disabled, the sensor device can be operated as normal and the presence of the emitter does not affect the device performance during normal operation. For example, between periods of measuring the breakdown voltage the emitter can be disabled and the SPAD or APD operated as normal without reduced device performance compared to an equivalent SPAD or APD not having an emitter. At a later time, the emitter can be activated again in order to measure the breakdown voltage again. In this way, a drift in breakdown voltage can be detected. The measurement process may be cyclic, wherein the emitter is activated at regular intervals and for a pre-determined amount of time.

Embodiments of the invention may provide an improved device and method for reliably measuring breakdown voltage of a pn-junction in, for example, an avalanche photodiode (APD) or a single photon avalanche diode (SPAD), and without requiring an external heat or light source to trigger breakdown. An additional pn-junction can be formed within the periphery of the sensor device to generate carriers by reverse biasing the pn-junction.

An advantage of the described embodiments is that they enable precise breakdown detection under dark environment conditions. The emitter is configured to provide carriers, which support the avalanche mechanism in the sensor device during the breakdown. In addition, the detection method can be independent of environmental factors such as the temperature, the time delay during the measurement, and the intensity of light sources.

While specific embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

The invention claimed is:

1. A semiconductor structure for measuring a breakdown voltage of a pn-junction, said semiconductor structure comprising:
   a substrate;
   a sensor device comprising an optical active region comprising said pn-junction in said substrate, wherein said sensor device is configured to apply a reverse bias voltage to said pn-junction; and
   an emitter located adjacent to said optical active region in said substrate and configured to provide charge carriers to said optical active region in order to trigger breakdown of said pn-junction when said reverse bias voltage is equal to or greater than said breakdown voltage, wherein said emitter comprises a heavily n-doped region and a heavily p-doped region.

2. The semiconductor structure of claim 1, wherein said emitter is configured to provide charge carriers when reverse biased.

3. The semiconductor structure of claim 1, wherein said emitter is configured to be reverse biased by a voltage in the range of 1 V to 5 V when in use.

4. The semiconductor structure of claim 1, wherein said emitter is separated from said optical active region by shallow trench isolation (STI), and wherein said heavily n-doped region is self-aligned at an edge of said STI.

5. The semiconductor structure of claim 1, wherein said heavily n-doped region is self-aligned against said heavily p-doped region.

6. The semiconductor structure of claim 1, wherein said sensor device further comprises a peripheral region surrounding said optical active region and comprising a circuit connected to said optical active region.

7. The semiconductor structure of claim 6, wherein said emitter is located within said peripheral region.

8. The semiconductor structure of claim 6, wherein said emitter comprises a plurality of emitter regions located in said peripheral region.

9. The semiconductor structure of claim 8, wherein said emitter regions are located symmetrically around said optical active region.

10. The semiconductor structure of claim 8, wherein said plurality of emitter regions includes four emitter regions.

11. The semiconductor structure of claim 8, wherein each emitter region has a substantially triangular shape when viewed from above.

12. An image sensor comprising a plurality of semiconductor structures as claimed in claim 1.

13. A method of measuring a breakdown voltage of a pn-junction with the semiconductor structure of claim 1.

14. A method of measuring a breakdown voltage of a pn-junction, said method comprising:
providing a semiconductor structure comprising a substrate, a sensor device comprising an optical active region comprising said pn-junction in said substrate, and an emitter located adjacent to said optical active region in said substrate;
applying a first reverse bias voltage to said pn-junction;
applying a second reverse bias voltage to said emitter to cause said emitter to provide charge carriers to said optical active region;
detecting breakdown of said pn-junction by monitoring a current output from said semiconductor structure; and
determining said breakdown voltage from said first reverse bias voltage when detecting said breakdown.

15. The method of claim 14, further comprising:
disabling said emitter by removing or reducing said second reverse bias voltage; and
after a time period, activating said emitter in order to determine said breakdown voltage at a later time.

* * * * *